United States Patent
Kobayashi et al.

(10) Patent No.: US 9,778,564 B2
(45) Date of Patent: Oct. 3, 2017

(54) IMPRINT MATERIAL

(71) Applicant: NISSAN CHEMICAL INDUSTRIES, LTD., Tokyo (JP)

(72) Inventors: Junpei Kobayashi, Funabashi (JP); Taku Kato, Funabashi (JP); Masayoshi Suzuki, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/784,400

(22) PCT Filed: Mar. 28, 2014

(86) PCT No.: PCT/JP2014/059205
§ 371 (c)(1),
(2) Date: Oct. 14, 2015

(87) PCT Pub. No.: WO2014/171302
PCT Pub. Date: Oct. 23, 2014

(65) Prior Publication Data
US 2016/0068674 A1   Mar. 10, 2016

(30) Foreign Application Priority Data

Apr. 18, 2013  (JP) ................ 2013-087545
Jun. 14, 2013  (JP) ................ 2013-125807

(51) Int. Cl.
| G03F 7/004 | (2006.01) |
| G03F 7/00 | (2006.01) |
| G03F 7/028 | (2006.01) |
| H01L 21/768 | (2006.01) |
| G03F 7/027 | (2006.01) |
| C08F 2/48 | (2006.01) |
| C08F 220/56 | (2006.01) |
| C08L 33/14 | (2006.01) |
| C09D 4/00 | (2006.01) |
| C08F 220/32 | (2006.01) |

(52) U.S. Cl.
CPC ............. *G03F 7/0002* (2013.01); *C08F 2/48* (2013.01); *C08F 220/56* (2013.01); *C08L 33/14* (2013.01); *C09D 4/00* (2013.01); *G03F 7/027* (2013.01); *G03F 7/028* (2013.01); *H01L 21/76817* (2013.01); *C08F 2220/325* (2013.01)

(58) Field of Classification Search
CPC ........ G03F 7/0002; G03F 7/027; G03F 7/028; H01L 21/14625; H01L 21/76817; C08F 220/56
USPC ............ 522/172, 174; 430/270.1, 281.1, 913
See application file for complete search history.

(56) References Cited

U.S. PATENT DOCUMENTS

| 5,772,905 | A | 6/1998 | Chou | |
| 2014/0216538 | A1* | 8/2014 | Kato | ........................ C08F 2/44 136/256 |

FOREIGN PATENT DOCUMENTS

| JP | 2008-019292 A | 1/2008 |
| JP | 2008-105414 A | 5/2008 |
| JP | 2008-202022 A | 9/2008 |
| JP | 2012-041521 A | 3/2012 |

OTHER PUBLICATIONS

Machine Translation of JP 2008-202022 (no date).*
Jun. 10, 2014 Search Report issued in International Patent Application No. PCTJP2014059205.
Jun. 10, 2014 Written Opinion issued in International Patent Application No. PCT/JP2014/059205.

* cited by examiner

*Primary Examiner* — Amanda C Walke
(74) *Attorney, Agent, or Firm* — Oliff PLC

(57) ABSTRACT

There is provided an imprint material that has sufficient adhesion to film substrates and excellent scratch resistance, and can be readily released from a mold at the time of mold release. An imprint material including: (A) a specific acrylamide such as N,N'-dimethylacrylamide; (B) a compound having alkylene oxide units and having 2 to 6 polymerizable groups at the ends of the compound, in which the alkylene oxide units are ethylene oxide units, propylene oxide units, or a combination thereof; and (C) a photopolymerization initiator.

18 Claims, No Drawings

IMPRINT MATERIAL

TECHNICAL FIELD

The present invention relates to an imprint material (a film forming composition for imprint) and a film that is formed from the material and to which a pattern is transferred. More specifically, the present invention relates to an imprint material that allows a resin film to be readily released from a mold at the time of mold release after curing and relates to a film that is formed from the material and to which a pattern having excellent adhesion to a substrate and excellent scratch resistance is transferred.

BACKGROUND ART

In 1995, Professor Chou et al. of current Princeton University unveiled a new technology called nano-imprint lithography (Patent Document 1). The nano-imprint lithography is a technology including bringing a mold having a certain pattern in contact with a substrate on which a resin film is formed, pressurizing the resin film, and using heat or light as external stimulus for curing to form a target pattern on the cured resin film. This nano-imprint lithography has advantages that nano-scale processing can be easily and inexpensively carried out as compared with photo-lithography in conventional semiconductor device production.

Therefore, instead of the photo-lithography, the nano-imprint lithography is a technology expected for applications in a semiconductor device, an opto-device, a display, a memory medium, and a bio-chip. Thus, various curable compositions for photo-nano-imprint lithography used for nano-imprint lithography have been disclosed (Patent Document 2 and Patent Document 3).

In the photo-nano-imprint lithography, a roll-to-roll method has been developed as a method for producing a pattern-transferred film in high efficiency in a large quantity. As a conventional roll-to-roll method developed for the photo-nano-imprint lithography, a method of using a flexible film as a substrate and using a material containing no solvents to which no solvents are added so that pattern dimension is difficult to be changed as a material used for the nano-imprint lithography (hereinafter, the material is abbreviated as an "imprint material" in this specification) is the mainstream.

PRIOR ART DOCUMENTS

Patent Documents

Patent Document 1: U.S. Pat. No. 5,772,905
Patent Document 2: Japanese Patent Application Publication No. 2008-105414 (JP 2008-105414 A)
Patent Document 3: Japanese Patent Application Publication No. 2008-202022 (JP 2008-202022 A)

SUMMARY OF THE INVENTION

Problem to be Solved by the Invention

As described above, the material containing no solvents is used for conventionally developed imprint material. However, the material fails to provide preferable adhesion between the film after the imprint and the substrate film in some cases.

When a costly mold is used in the nano-imprint lithography, longer lifetime is required for the mold. At the time of mold release, when force required for peeling off the cured resin film from the mold (hereinafter, abbreviated as "mold release force" in this specification) is large, however, the resin is easily attached to the mold and thus the mold tends to be unusable. Therefore, the imprint material should require low mold release strength (a property that the cured resin film is easily peeled off from the mold).

For a product such as a solid state imaging device, a solar cell, an LED device, and a display, scratch resistance may be required to a structure prepared as an optical member inside or at the surface of the product.

However, although various imprint materials have been disclosed, the materials having sufficient adhesion to the film substrate, requiring low mold release force (the property that the cured resin film is easily peeled off from the mold), and having excellent scratch resistance have not been specifically investigated or reported.

The present invention is achieved based on the above described situations, and an object obtained by solving the problem is to provide an imprint material that has sufficient adhesion to a film substrate and excellent scratch resistance and allows a resin film to be readily released from a mold at the time of mold release, and a film that is prepared from the material and to which a pattern is transferred.

Specifically, an object of the present invention is to provide an imprint material that forms a film having no peeling off in a crosscut test for evaluating adhesion of the coating film, requiring a mold release force of 0.5 g/cm or less, and resulting in almost no scratches (resulting in only one or no scratch) from a scratch test using steel wool carried out on the film after a pattern transfer.

Means for Solving the Problem

As a result of intensive investigation for solving the problem, the inventors of the present invention have found the following astonishing findings. The use of a material containing a compound having propylene oxide units and/or ethylene oxide units and having polymerizable groups at the ends of the compound, a given (meth)acrylamide compound, and a photopolymerization initiator as the imprint material significantly reduces mold release force measured at the time of peeling off a cured film to which a mold pattern is transferred by photo-curing of the material on the surface of the mold from the surface of the mold, exhibits excellent adhesion between the pattern-transferred film made of the material and the substrate, and results in almost no scratches from the scratch test using steel wool carried out on the pattern. Therefore, the inventors of the present invention have accomplished the present invention.

Specifically, the present invention relates to, as a first aspect, an imprint material comprising:
an (A) component;
a (B) component; and
a (C) component:
(A) a compound of Formula (1);
(B) a compound having alkylene oxide units and having 2 to 6 polymerizable groups at the ends of the compound, in which the alkylene oxide units are ethylene oxide units, propylene oxide units, or a combination thereof; and (C) a photopolymerization initiator

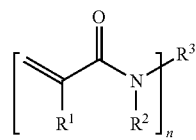

(in the formula, $R^1$ is a hydrogen atom or a methyl group; $R^2$ is a hydrogen atom or a $C_{1-3}$ alkyl group; n is 1 or 2;

when n is 1, $R^3$ is a $C_{1-12}$ alkyl group optionally substituted with at least one substituent selected from the group consisting of a hydroxy group, a carboxy group, an acetyl group, an amino group in which one or two hydrogen atoms are optionally substituted with a methyl group, a sulfo group, and a $C_{1-4}$ alkoxy group; and when n is 2, $R^3$ is a $C_{1-12}$ alkylene group optionally substituted with at least one substituent selected from the group consisting of a hydroxy group, a carboxy group, an acetyl group, an amino group in which one or two hydrogen atoms are optionally substituted with a methyl group, a sulfo group, and a $C_{1-4}$ alkoxy group).

The present invention relates to, as a second aspect, the imprint material according to the first aspect, in which the (A) component is contained in an amount of 0.05% by mass or more and 10% by mass or less relative to the total mass of the (A) component and the (B) component.

The present invention relates to, as a third aspect, the imprint material according to the first aspect or the second aspect, further comprising a silicone compound as a (D) component.

The present invention relates to, as a fourth aspect, the imprint material according to any one of the first aspect to the third aspect, further comprising a surfactant as an (E) component.

The present invention relates to, as a fifth aspect, the imprint material according to any one of the first aspect to the fourth aspect, further comprising a solvent as an (F) component.

The present invention relates to, as a sixth aspect, the imprint material according to any one of the first aspect to the fifth aspect, in which the (B) component is a compound having two polymerizable groups.

The present invention relates to, as a seventh aspect, the imprint material according to any one of the first aspect to the sixth aspect, in which the (B) component is a compound having two groups of at least one polymerizable group selected from the group consisting of an acryloyloxy group, a methacryloyloxy group, a vinyl group, and an allyl group.

The present invention relates to, as an eighth aspect, a film that is formed from the imprint material according to any one of the first aspect to the seventh aspect and to which a pattern is transferred.

The present invention relates to, as a ninth aspect, an optical member comprising the pattern-transferred film according to the eighth aspect provided on a substrate.

The present invention relates to, as a tenth aspect, a solid state imaging device comprising the pattern-transferred film according to the eighth aspect provided on a substrate.

The present invention relates to, as an eleventh aspect, an LED device comprising the pattern-transferred film according to the eighth aspect provided on a substrate.

The present invention relates to, as a twelfth aspect, a semiconductor device comprising the pattern-transferred film according to the eighth aspect.

The present invention relates to, as a thirteenth aspect, a solar cell comprising the pattern-transferred film according to the eighth aspect provided on a substrate.

The present invention relates to, as a fourteenth aspect, a display comprising the pattern-transferred film according to the eighth aspect provided on a substrate.

The present invention relates to, as a fifteenth aspect, an electronic device comprising the pattern-transferred film according to the eighth aspect provided on a substrate.

Effects of the Invention

The imprint material of the present invention contains the compound having propylene oxide units and/or ethylene oxide units and having 2 to 6 polymerizable groups at the ends in its molecule and contains the compound of Formula (1), whereby the cured film prepared using the imprint material provides sufficient adhesion to the film substrate, requires low mold release strength, and has high scratch resistance.

The imprint material of the present invention can be cured by light and does not cause peeling off a part of the pattern at the time of releasing from the surface of the mold. As a result, a film on which a desired pattern is precisely formed can be obtained. Therefore, the excellent pattern formation of photo-imprint can be achieved.

The film formed from the imprint material of the present invention can be formed onto any substrates. The formed film and the film substrate have sufficient adhesion. The film requires low mold release force and has scratch resistance. Therefore, a pattern-transferred film formed after imprint can be suitably used for producing an optical member requiring scratch resistance such as a solid state imaging device, a solar cell, an LED device, and a display.

By changing the type and the content ratio of the compound of the (B) component, the curing rate, the dynamic viscosity, and the film thickness of the imprint material of the present invention can be controlled. Therefore, a material fitting to a device type to be produced and types of an exposure process and a baking process can be designed with the imprint material of the present invention. This enables the process margin to be enlarged and thus the imprint material can be suitably used for production of optical members.

MODES FOR CARRYING OUT THE INVENTION

[(A) Component: Compound of Formula (1)]

The compound of the (A) component is a compound of Formula (1), that is, a compound having a (meth)acrylamide structure in its structure.

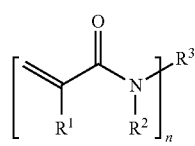

In Formula (1), $R^1$ is a hydrogen atom or a methyl group; $R^2$ is a hydrogen atom or a $C_{1-3}$ alkyl group; and n is 1 or 2.

When n is 1, $R^3$ is a $C_{1-12}$ alkyl group optionally substituted with at least one substituent selected from the group consisting of a hydroxy group, a carboxy group, an acetyl group, an amino group in which one or two hydrogen atoms are optionally substituted with a methyl group, a sulfo group, and a $C_{1-4}$ alkoxy group, whereas when n is 2, $R^3$ is a $C_{1-12}$ alkylene group optionally substituted with at least one substituent selected from the group consisting of a hydroxy group, a carboxy group, an acetyl group, an amino group in which one or two hydrogen atoms are optionally substituted with a methyl group, a sulfo group, and a $C_{1-4}$ alkoxy group.

The $C_{1-12}$ alkyl groups may be any of linier, branched, or cyclic alkyl groups. Specific examples may include methyl group, ethyl group, n-propyl group, isopropyl group, cyclopropyl group, n-butyl group, isobutyl group, sec-butyl group, tert-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, 2-ethyl-3-methyl-cyclopropyl group, n-heptyl group, n-octyl group, n-nonyl group, n-decyl group, n-undecyl group, and n-dodecyl group.

Specific examples of the $C_{1-3}$ alkyl groups may include the $C_{1-3}$ alkyl groups of the $C_{1-12}$ alkyl groups exemplified above.

The $C_{1-12}$ alkylene groups may be any of linier, branched, or cyclic alkylene groups. Specific examples may include methylene group, ethylene group, propane-1,2-diyl group, propane-1,3-diyl group, 2,2-dimethylpropane-1,3-diyl group, 2-ethyl-2-methylpropane-1,3-diyl group, 2,2-diethyl-propane-1,3-diyl group, 2-methyl-2-propylpropane-1,3-diyl group, butane-1,3-diyl group, butane-2,3-diyl group, butane-1,4-diyl group, 2-methylbutane-2,3-diyl group, 2,3-dimethylbutane-2,3-diyl group, pentane-1,3-diyl group, pentane-1,5-diyl group, pentane-2,3-diyl group, pentane-2,4-diyl group, 2-methylpentane-2,3-diyl group, 3-methylpentane-2,3-diyl group, 4-methylpentane-2,3-diyl group, 2,3-dimethylpentane-2,3-diyl group, 3-methylpentane-2,4-diyl group, 3-ethylpentane-2,4-diyl group, 3,3-dimethylpentane-2,4-diyl group, 2,4-dimethylpentane-2,4-diyl group, hexane-1,6-diyl group, hexane-1,2-diyl group, hexane-1,3-diyl group, hexane-2,3-diyl group, hexane-2,4-diyl group, hexane-2,5-diyl group, 2-methylhexane-2,3-diyl group, 4-methylhexane-2,3-diyl group, 3-methylhexane-2,4-diyl group, 2,3-dimethylhexane-2,4-diyl group, 2,4-dimethylhexane-2,4-diyl group, 2,5-dimethylhexane-2,4-diyl group, 2-methylhexane-2,5-diyl group, 3-methylhexane-2,5-diyl group, and 2,5-dimethylhexane-2,5-diyl group.

Specific examples of the compound of Formula (1) may include (meth)acrylamide, N,N'-dimethyl(meth)acrylamide, N,N'-diethyl(meth)acrylamide, N-[3-(dimethylamino)propyl](meth)acrylamide, N-isopropyl(meth)acrylamide, N-(hydroxymethyl)(meth)acrylamide, N-(2-hydroxyethyl)(meth)acrylamide, N-dodecyl(meth)acrylamide, diacetone (meth)acrylamide, N-tert-butyl(meth)acrylamide, N-(butoxymethyl)(meth)acrylamide, 2-(meth)acrylamide-2-methylpropanesulfonic acid, 6-(meth)acrylamidehexanoic acid, N,N'-(1,2-dihydroxyethylene)bis(meth)acrylamide, and N,N'-methylenebis(meth)acrylamide. In this specification, the (meth)acrylamide compound indicates both of the acrylamide compound and the methacrylamide compound.

Among them, the compound of Formula (1) is preferably N,N'-dimethyl(meth)acrylamide, N,N'-diethyl(meth)acrylamide, and N,N'-(1,2-dihydroxyethylene)bis(meth)acrylamide and, among them, the acrylamide compounds are most preferable from the viewpoint of achieving adhesion with an extremely slight amount of addition.

The compound of the (A) component may be used singly or in combination of two or more of the compounds.

[(B) Component: Compound Having Alkylene Oxide Units and Having 2 to 6 Polymerizable Groups at its Ends]

The compound of the (B) component indicates a compound in one molecule having one or more of propylene oxide units, one or more of ethylene oxide units, or one or more of each of propylene oxide units and ethylene oxide units and specifically having 2 to 6 polymerizable groups at both ends of the compound. Examples of the propylene oxide unit may include (—CH(CH$_3$)CH$_2$O—) and (—CH$_2$CH$_2$CH$_2$O—) and examples of the ethylene oxide unit may include (—CH$_2$CH$_2$O—).

Examples of the polymerizable groups may include an acryloyloxy group, a methacryloyloxy group, a vinyl group, and an allyl group. The acryloyloxy group may be called an acryloxy group and the methacryloyloxy group may be called a methacryloxy group.

As the compound of the (B) component, examples of the compound having one or more of ethylene oxide units and having two to six polymerizable groups at the ends in one molecule may include methoxypolyethylene glycol (meth)acrylate, phenoxy polyethylene glycol (meth)acrylate, ethylene glycol di(meth)acrylate, polyethylene glycol di(meth)acrylate, ethoxylated bisphenol A di(meth)acrylate, ethoxylated trimethyloipropane tri(meth)acrylate, ethoxylated glycerin tri(meth)acrylate, ethoxylated pentaerythritol tetra(meth)acrylate, and ethoxylated dipentaerythritol hexa (meth)acrylate. In this specification, the (meth)acrylate compound indicates both the acrylate compound and the methacrylate compound. For example, (meth)acrylic acid indicates acrylic acid and methacrylic acid.

The compound is commercially available and specific examples of the compound may include AM-30G, AM-90G, AM-130G, AM-230G, AMP-10G, AMP-20GY, AMP-60G, PHE-1G, A-200, A-400, A-600, A-1000, 1G, 2G, 3G, 4G, 9G, 14G, 23G, ABE-300, A-BPE-4, A-BPE-6, A-BPE-10, A-BPE-20, A-BPE-30, BPE-80N, BPE-100N, BPE-200, BPE-500, BPE-900, BPE-1300N, A-GLY-3E, A-GLY-9E, A-GLY-20E, A-TMPT-3EO, A-TMPT-9EO, ATM-4E, ATM-35E, and A-DPH-12E (mentioned above are manufactured by Shin-Nakamura Chemical Co., Ltd.), KAYARAD (registered trademark) DPEA-12, KAYARAD PEG400DA, KAYARAD THE-330, and KAYARAD RP-1040 (mentioned above are manufactured by Nippon Kayaku Co., Ltd.), M-210 and M-350 (mentioned above are manufactured by Toagosei Co., Ltd.).

As the compound of the (B) component, examples of the compound having one or more of propylene oxide units and having two to six polymerizable groups at the ends in one molecule in the compounds may include dipropylene glycol di(meth)acrylate, tripropylene glycol di(meth)acrylate, polypropylene glycol #400di(meth)acrylate, polypropylene glycol #700di(meth)acrylate, and propoxylated dipentaerythritol hexaacrylate.

The compound is commercially available and specific examples of the compound may include APG-100, APG-200, APG-400, APG-700, 3PG, 9PG, A-DPH-6P (mentioned above are manufactured by Shin-Nakamura Chemical Co., Ltd.), FANCRYL (registered trademark) FA-P240A and FANCRYL FA-P270A (manufactured by Hitachi Chemical Industry Co. Ltd.).

As the compound of the (B) component, examples of the compound having one or more of each of propylene oxide units and ethylene oxide units and having two to six polymerizable groups at ends in one molecule may include ethylene oxide-propylene oxide copolymer di(meth)acrylic acid ester, propoxylated ethoxylated bisphenol A di(meth)acrylate, ethoxylated polypropylene glycol #700di(meth)acrylate.

The compound is commercially available and specific examples of the compound may include A-1000PER A-B1206PE (mentioned above are manufactured by Shin-Nakamura Chemical Co., Ltd.), and FANCRYL (registered trademark) FA-023M (manufactured by Hitachi Chemical Industry Co. Ltd.).

The compound of the (B) component can be used singly or in combination of two or more of the compounds.

The (B) component in the present invention can provide the scratch resistance to the film after pattern transfer and assists bleed-out of the silicone compound of the (D) component described below at the time of curing at imprint, whereby the mold release force measured at the time of peeling off the resin film (cured film) from the surface of the mold can be reduced.

By changing the type and the content ratio of the compound of the (B) component, the dynamic viscosity of the imprint material and the curing rate and the thickness of the formed film at the time of imprint can be controlled.

The content ratio of the (A) component in the imprint material of the present invention is 0.05% by mass or more and 10% by mass or less based on the total mass of the (A) component and the (B) component or based on the total mass of the (A) component, the (B) component, and the (G) component described later when the (G) component is contained.

The ratio of the (A) component of less than 0.05% by mass deteriorates the adhesion to the substrate of the film obtained by photo-imprint, whereas addition of the (A) component of more than 10% by mass causes extreme deterioration in the scratch resistance.

[(C) Component: Photopolymerization Initiator]

The photopolymerization initiator as the (C) component is not limited as long as photopolymerization initiators absorb light from the light source used at the time of photo-curing. Examples of the photopolymerization initiator may include organic peroxides such as tert-butylperoxy-iso-phthalate, 2,5-dimethyl-2,5-bis(benzoyldioxy)hexane, 1,4-bis[α-(tert-butyldioxy)-iso-propoxy]benzene, di-tert-butylperoxide, 2,5-dimethyl-2,5-bis(tert-butyldioxy)hexene hydroperoxide, α-(iso-propylphenyl)-iso-propyl hydroperoxide, tert-butyl hydroperoxide, 1,1-bis(tert-butyldioxy)-3,3,5-trimethylcyclohexane, butyl-4,4-bis(tert-butyldioxy)valerate, cyclohexanone peroxide, 2,2',5,5'-tetra(tert-butylperoxycarbonyl) benzophenone, 3,3',4,4'-tetra(tert-butylperoxycarbonyl) benzophenone, 3,3',4,4'-tetra(tert-amylperoxycarbonyl) benzophenone, 3,3',4,4'-tetra(tert-hexylperoxycarbonyl) benzophenone, 3,3'-bis(tert-butylperoxycarbonyl)-4,4'-dicarboxybenzophenone, tert-butylperoxy benzoate, and di-tert-butyldiperoxy isophthalate; quinones such as 9,10-anthraquinone, 1-chloroanthraquinone, 2-chloroanthraquinone, octamethylanthraquinone, and 1,2-benzanthraquinone; benzoin derivatives such as benzoin methyl, benzoin ethyl ether, α-methylbenzoin, and α-phenylbenzoin; alkylphenone-based compounds such as 2,2-dimethoxy-1,2-diphenylethan-1-one, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-[4-{4-(2-hydroxy-2-methyl-propionyl) benzyl}-phenyl]-2-methyl-propan-1-one, phenylglyoxylic acid methyl ester, 2-methyl-1-[4-(methylthio)phenyl]-2-morpholinopropan-1-one, 2-benzyl-2-dimethylamino-1-(4-morpholinophenyl)-butan-1-one, and 2-dimethylamino-2-(4-methyl-benzyl)-1-(4-morpholin-4-yl-phenyl)-butan-1-one; acyl phosphine oxide-based compounds such as bis(2, 4,6-trimethylbenzoyl)-phenylphosphine oxide and 2,4,6-trimethylbenzoyl-diphenyl-phosphine oxide; and oxime ester-based compounds such as 1,2-octanedione, 1-[4-(phenylthio)-,2-(O-benzoyloxime)], ethanone, and 1-[9-ethyl-6-(2-methylbenzoyl)-9H-carbazol-3-yl]-,1-(O-acetyloxime).

The compound is commercially available and specific examples of the compound may include IRGACURE (registered trademark) 651, IRGACURE 184, IRGACURE 500, IRGACURE 2959, IRGACURE 127, IRGACURE 754, IRGACURE 907, IRGACURE 369, IRGACURE 379, IRGACURE 379EG IRGACURE 819, IRGACURE 819DW, IRGACURE 1800, IRGACURE 1870, IRGACURE 784, IRGACURE OXE01, IRGACURE OXE02, IRGACURE 250, Darocur (registered trademark) 1173, Darocur MBF, Darocur 4265, Lucirin (registered trademark) TPO (mentioned above are manufactured by BASF Japan Ltd.), KAYACURE (registered trademark) DETX, KAYACURE MBP, KAYACURE DMBI, KAYACURE EPA, KAYACURE OA (mentioned above are manufactured by Nippon Kayaku Co., Ltd.), VICURE-10, VICURE 55 (mentioned above are manufactured by Stauffer Co. Ltd.), ESACURE (registered trademark) KIP150, ESACURE TZT, ESACURE 1001, ESACURE KTO46, ESACURE KB1, ESACURE KL200, ESACURE KS300, ESACURE EB3, Triazine-PMS, Triazine A, Triazine B (mentioned above are manufactured by Japan Siber-Hegner KK), ADEKA OPTOMER N-1717, ADEKA OPTOMER N-1414, and ADEKA OPTOMER N-1606 (manufactured by ADEKA CORPORATION).

The photopolymerization initiator can be used singly or in combination of two or more of the photopolymerization initiators.

The content of the (C) component in the imprint material of the present invention is preferably 0.1 phr to 30 phr and more preferably 1 phr to 20 phr based on the total mass of the (A) component and the (B) component or the total mass of the (A) component, the (B) component, and the (G) component described below when the compound includes the (G) component. This is because the ratio of the content of the (C) component of less than 0.1 phr results in an insufficient curing property and thus deterioration in the patterning property and reduction in the scratch resistance occur. The term "phr" in the specification means the mass of photopolymerization initiator to a total mass of the (A) component and the (B) component of 100 g or a total mass of the (A) component, the (B) component, and the (G) component described below of 100 g when the compound includes the (G) component.

[(D) Component: Silicone Compound]

In the present invention, a silicone compound can be contained as an optional component. The silicone compound as the (D) component is a compound having a silicone framework (siloxane framework) in the molecule and particularly preferably having a dimethylsilicone framework.

The compound is commercially available and specific examples of the compound may include BYK-302, BYK-307, BYK-322, BYK-323, BYK-330, BYK-333, BYK-370, BYK-375, BYK-378, BYK-UV 3500, and BYK-UV 3570 (mentioned above are manufactured by BYK Japan KK), X-22-164, X-22-164AS, X-22-164A, X-22-164B, X-22-164C, X-22-164E, X-22-163, X-22-169AS, X-22-174DX, X-22-2426, X-22-9002, X-22-2475, X-22-4952, KF-643, X-22-343, X-22-2404, X-22-2046, and X-22-1602 (mentioned above are manufactured by Shin-Etsu Chemical Co., Ltd.).

The compound having a silicone framework can be used singly or in combination of two or more of the compounds.

The content of the (D) component in the imprint material of the present invention is preferably 0.2 phr to 4 phr and more preferably 0.5 phr to 2 phr based on the total mass of the (A) component and the (B) component or based on the total mass of the (A) component, the (B) component, and the (G) component described later when the (G) component is contained. The ratio of less than 0.2 phr results in insufficient low mold release strength, whereas the ratio of more than 4 phr may result in insufficient curing and thus a patterning property may deteriorate.

[(E) Component: Surfactant]

In the present invention, a surfactant may be included as the optional component. The surfactant as the (E) component plays a role of adjusting a film forming property of the coating film to be obtained.

Examples of the surfactant may include a nonionic surfactant such as polyoxyethylene alkyl ethers including polyoxyethylene lauryl ether, polyoxyethylene stearyl ether, polyoxyethylene cetyl ether, and polyoxyethylene oleyl ether; polyoxyethylene alkylaryl ethers including polyoxyethylene octylphenyl ether and polyoxyethylene nonylphenyl ether; polyoxyethylene-polyoxypropylene block copolymers; sorbitan fatty acid esters including sorbitan monolaurate, sorbitan monopalmitate, sorbitan monostearate, sorbitan monooleate, sorbitan trioleate, and sorbitan tristearate; and polyoxyethylene sorbitan fatty acid esters including polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; a fluorochemical surfactant such as Eftop (registered trademark) EF301, Eftop EF303, Eftop EF352 (manufactured by Mitsubishi Materials Electronic Chemicals Co., Ltd), Megafac (registered trademark) F-171, Megafac F-173, Megafac F-477, Megafac F-486, Megafac F-554, Megafac F-556, Megafac R-08, Megafac R-30, Megafac R-30N (manufactured by DIC Corporation), Fluorad FC430, Fluorad FC431 (manufactured by Sumitomo 3M Ltd.), Asahi guard (registered trademark) AG710, Surflon (registered trademark)S-382, Surflon SC101, Surflon SC102, Surflon SC103, Surflon SC104, Surflon SC105, Surflon SC106 (manufactured by Asahi Glass Co., Ltd.); and Organosiloxane Polymer KP341 (manufactured by Shin-Etsu Chemical Co., Ltd.).

The surfactant can be used singly or in combination of two or more of the surfactants. When the surfactant is used, the ratio is preferably 0.01 phr to 40 phr and more preferably 0.01 phr to 10 phr based on the total mass of the (A) component and (B) component or the total mass of the (A) component, the (B) component, and the (G) component described below when the compound includes the (G).

[(F) Component: Solvent]

In the present invention, a solvent may be added as the (F) component. The solvent (F) as the optional component plays a role of adjusting viscosities of the compound as the (A) component and (B) component, and the (A) component, the (B) component, and the (G) component described below when the compound includes the (G) component.

Examples of the solvent may include toluene, p-xylene, o-xylene, styrene, ethylene glycol dimethyl ether, propylene glycol monomethyl ether, ethylene glycol monomethyl ether, propylene glycol monoethyl ether, ethylene glycol monoethyl ether, ethylene glycol mono-isopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, 2-heptanone, ethyl acetate, isopropyl acetate, n-propyl acetate, isobutyl acetate, n-butyl acetate, ethyl lactate, ethyl pyruvate, methanol, ethanol, isopropanol (2-propanol), tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, trimethylene glycol, 1-methoxy-2-butanol, isopropyl ether, 1,4-dioxane, N,N-dimethylformamide, N,N-dimethylacetamide, N-methyl-2-pyrrolidone, 1,3-dimethyl-2-imidazolidinone, dimethyl sulfoxide, and N-cyclohexyl-2-pyrrolidine. The solvent is not particularly limited as long as the solvent can adjust the viscosities of the (A) component, the (B) component, and the (G) component.

The solvent can be used singly or in combination of two or more of the solvents.

When the solvent is used, the solvent is preferably contained at the ratio of solid content, which is defined as the content after removing the solvent as the (F) component from the total components of the imprint material of the present invention, that is, the total components of the (A) component to the (C) component and other additives described below, of 20% by mass to 80% by mass and preferably 40% by mass to 60% by mass to the total amount of the imprint material.

[(G) Component: Compound Having Three or More Polymerizable Groups at its Ends and Having No Alkylene Oxide Units]

In the present invention, as long as the effect of the present invention is not impaired, a compound having three or more polymerizable groups at the ends of the compound and having no alkylene oxide units may be contained as the (G) component. A compound having three or more polymerizable groups at the ends of the compound and having no alkylene oxide units as the (G) component plays a role of adjusting hardness of the film obtained by photo-imprint. Examples of the polymerizable groups may include acryloyloxy group, methacryloyloxy group, vinyl group, and allyl group.

Examples of the compound as the (G) component may include pentaerythritol triacrylate, trimethyloipropane tri(meth)acrylate, s-caprolactone-modified tris-(2-acryloxyethyl)isocyanurate, pentaerythritol tetraacrylate, ditrimethylolpropane tetraacrylate, dipentaerythritol hexaacrylate, dipentaerythritol polyacrylate, pentaerythritol triacrylate hexamethylenediisocyanate urethane prepolymer, pentaerythritol triacrylate toluenediisocyanate urethane prepolymer, pentaerythritol triacrylate isophoronediisocyanate urethane prepolymer, and dipentaerythritol pentaacrylate hexamethylenediisocyanate urethane prepolymer.

The compound is commercially available and specific examples of the compound may include NK ester A-TMM-3LMN, NK ester A-TMPT, NK ester TMPT, NK ester A-TMMT, NK ester AD-TMP, NK ester A-DPH, NK ester A-9550, NK ester A-9530, NK ester ADP-51 EH, and NK ester ATM-31 EH (mentioned above are manufactured by Shin-Nakamura Chemical Co., Ltd.), KAYARAD (registered trademark) T-1420, KAYARAD D-330, KAYARAD D-310, KAYARAD DPCA-20, KAYARAD DPCA-30, KAYARAD DPCA-60, KAYARAD DPCA-120, KAYARAD TMPTA, KAYARAD PET-30, and KAYARAD DPHA (mentioned above are manufactured by Nippon Kayaku Co., Ltd.), UA-306H, UA-306T, UA-306I, and UA-510H (mentioned above are manufactured by Kyoeisha Chemical Co., Ltd.).

The compound having three or more polymerizable groups at the ends of the compound and having no alkylene oxide units can be used singly or in combination of two or more of the compounds. When compound having three or more polymerizable groups and having no alkylene oxide units is used, the ratio of the compound is preferably 10 phr to 70 phr and more preferably 10 phr to 60 phr to the mass of the (B) component.

[Other Additives]

As long as the effect of the present invention is not impaired, the imprint material of the present invention can contain an epoxy compound, a photoacid generator, a photosensitizer, an ultraviolet absorber, an antioxidant, an adhesion promoting agent, or a mold release improver, if necessary.

Examples of the epoxy compound may include Epolead (registered trademark) GT-401, Epolead PB3600, Celloxide (registered trademark) 2021P, Celloxide 2000, Celloxide 3000, EHPE3150, Celloxide EHPE3150CE, Cyclomer (registered trademark) M100 (mentioned above are manufactured by DAICEL CORPORATION), EPICLON (registered trademark) 840, EPICLON 840-S, EPICLON N-660, and EPICLON N-673-80M (mentioned above are manufactured by DIC Corporation).

Examples of the photoacid generator may include IRGACURE (registered trademark) PAG103, IRGACURE PAG108, IRGACURE PAG121, IRGACURE PAG203, IRGACURE CGI725 (mentioned above are manufactured by BASF Japan Ltd.), WPAG-145, WPAG-170, WPAG-199, WPAG-281, WPAG-336, WPAG-367 (mentioned above are manufactured by Wako Pure Chemical Industries, Ltd.), TFE Triazine, TME-Triazine, MP-Triazine, Dimethoxytriazine, TS-91, and TS-01 (SANWA CHEMICAL CO., LTD.).

Examples of the photosensitizer may include thioxanthene-based, xanthene-based, ketone-based, thiopyrylium salt-based, base styryl-based, merocyanine-based, 3-substituted coumarin-based, 3,4-substituted coumarin-based, cyanine-based, acridine-based, thiazine-based, phenothiazine-based, anthracene-based, coronene-based, benzanthracene-based, perylene-based, ketocoumarin-based, coumarin-based, and borate-based photosensitizers.

The photosensitizer can be used singly or in combination of two or more of the photosensitizers. The absorption wavelength in the UV region can be adjusted by using the photosensitizer.

Examples of the ultraviolet absorber may include TINUVIN (registered trademark) PS, TINUVIN 99-2, TINUVIN 109, TINUVIN 328, TINUVIN 384-2, TINUVIN 400, TINUVIN 405, TINUVIN 460, TINUVIN 477, TINUVIN 479, TINUVIN 900, TINUVIN 928, TINUVIN 1130, TINUVIN 111FDL, TINUVIN 123, TINUVIN 144, TINUVIN 152, TINUVIN 292, TINUVIN 5100, TINUVIN 400-DW, TINUVIN 477-DW, TINUVIN 99-DW, TINUVIN 123-DW, TINUVIN 5050, TINUVIN 5060, and TINUVIN 5151 (mentioned above are manufactured by BASF Japan Ltd.).

The ultraviolet absorber can be used singly or in combination of two or more of the ultraviolet absorbers. By using the ultraviolet absorber, the curing rate of the outmost surface of the film can be controlled at the time of photo-curing and thus the mold release property may be improved.

Examples of the antioxidant may include IRGANOX (registered trademark) 1010, IRGANOX 1035, IRGANOX 1076, IRGANOX 1135, and IRGANOX 1520L (mentioned above are manufactured by BASF Japan Ltd.).

The antioxidant can be used singly or in combination of two or more of the antioxidants. By using the antioxidant, color change of the film in yellow caused by oxidation can be prevented.

Examples of the adhesion promoting agent may include 3-methacryloxypropyltrimethoxysilane and 3-acryloxypropyltrimethoxysilane. By using the adhesion promoting agent, the adhesion to the substrate is improved. The content of the adhesion promoting agent is preferably 5 phr to 50 phr and more preferably 10 phr to 50 phr based on the total mass of the (A) component and the (B) component or the total mass of the (A) component, the (B) component, and the (G) component described above when the compound includes the (G).

Examples of the mold release improver may include a fluorine-containing compound. Examples of the fluorine-containing compound may include R-5410, R-1420, M-5410, M-1420, E-5444, E-7432, A-1430, and A-1630 (mentioned above are manufactured by DAIKIN INDUSTRIES, LTD).

[Preparation of Imprint Material]

Although a method for preparing the imprint material of the present invention is not particularly limited and the method includes mixing the (A) component, the (B) component, the (C) component, optional components including the (D) component, the (E) component, the (F) component, and the (G) component, and other additives, if desired, so that the imprint material is in a homogeneous state.

The order at the time of mixing the (A) component to the (G) component and optionally mixing the other additives does not matter as long as the homogeneous imprint material is obtained and is not particularly limited. Examples of the preparation method may include a method mixing the (B)

component with the (A) component in a predetermined ratio. Examples of the method may also include further mixing the (C) component, the (D) component, the (E) component, the (F) component, or the (G) component with the mixture as appropriate to form the homogeneous imprint material. In the adequate stage of the preparation method, a method including further adding and mixing the other additives is included, if necessary.

[Photo-Imprint and Pattern-Transferred Film]

The imprint material of the present invention can provide a desired film by applying the imprint material onto the substrate and curing the coated film by light. Examples of applying methods may include publicly known or widely known methods such as a spin coating method, a dipping method, a flow coating method, an ink jet method, a spray method, a bar coating method, a gravure coating method, a slit coating method, a roll coating method, a transferring printing method, a brush coating, a blade coating method, and an air knife coating method.

Examples of the substrate to which the imprint material of the present invention is applied may include a substrate made from silicon, glass on which an indium-tin oxide (ITO) film is formed (hereinafter abbreviated as "ITO substrate" in this specification), glass on which a silicon nitride (SiN) film is formed (SiN substrate), glass on which an indium-zinc oxide (IZO) film is formed, polyethylene terephthalate (PET), triacetyl cellulose (TAC), acryl, plastic, glass, quartz, and ceramic. Flexible substrates having flexibility can also be used. Examples of the flexible substrates may include triacetyl cellulose, polyethylene terephthalate, polymethyl methacrylate, a cyclo-olefin-(co)polymer, polyvinyl alcohol, polycarbonate, polystyrene, a polyimide, a polyamide, a polyolefin, polypropylene, polyethylene, polyethylene naphthalate, polyether sulfone, and a copolymer made from combination of these polymers.

Examples of the light source that is used to cure the imprint material of the present invention, which are not particularly limited, may include a high-pressure mercury vapor lamp, low-pressure mercury vapor lamp, an electrodeless lamp, a metal halide lamp, a KrF excimer laser, an ArF excimer laser, a $F_2$ excimer laser, electron beams (EB), and extreme ultraviolet (EUV). Generally, the wavelength of a G-line of 436 nm, an H-line of 405 nm, an I-line of 365 nm, or GHI mixed lines can be used. An exposure amount is preferably 30 mJ/cm$^2$ to 2000 mJ/cm$^2$ and more preferably 30 mJ/cm$^2$ to 1000 mJ/cm$^2$.

When the solvent as the (F) component is used, a baking step can be added in order to evaporate the solvent in the coating film at least before or after light irradiation. Examples of the baking device, which is not particularly limited, may include devices that can bake the coating film using a hot plate, an oven, or a furnace under an adequate atmosphere, that is, under air or inert gas such as nitrogen or in vacuum. A baking temperature is not particularly limited in order to evaporate the solvent and the baking can be carried out, for example, at 40° C. to 200° C.

The device for carrying out the photo-imprint is not particularly limited as long as a target pattern can be obtained. For example, the following method can be used. The method for carrying out the photo-imprint includes using a commercially available device such as ST50 manufactured by TOSHIBA MACHINE CO., LTD., Sindre (registered trademark) 60 manufactured by OBDUCAT AB (publ), and NM-0801HB manufactured by MEISYO KIKO Co., Ltd. to bond the substrate and the mold by pressure using a roller; and releasing the cured film from the mold after photo-curing.

Examples of the mold material used in the photo-imprint used in the present invention may include quartz, silicon, nickel, alumina, carbonyl silane, and glassy carbon. However, the mold material is not particularly limited as long as the target pattern can be obtained. In order to improve the mold release property, mold release treatment may be carried out in which a thin film of a fluorine-based compound or the like is formed on the surface of a mold. Examples of a mold release agent used for the mold release treatment may include OPTOOL (registered trademark) HD and OPTOOL DSX manufactured by DAIKIN INDUSTRIES, LTD. However, the mold release agent is not particularly limited as long as the target pattern can be obtained.

The pattern size of the photo-imprint is in the nano-meter order and specifically the size is in a pattern size of less than 1 micron.

In the present invention, the 90° peeling test for evaluating the mold release force is a test in which generally, a bonding body (in the present invention, corresponding to the cured film formed from the imprint material) is bonded to a bonded body (in the present invention, corresponding to the film) and a resistance force (tensile force) generated at the time of peeling off the bonding body after predetermined time in a 90° direction at a predetermined peeling speed is measured. Usually, the measurement is carried out according to the evaluation method with reference to JIS Z0237. The value of the resistance force measured in this test is converted into the value per unit width of the bonding body, and the converted value can be evaluated as the mold release force.

In the test, the imprint material of the present invention is applied onto a film, the coating film on the film is bonded to the surface of a mold, subsequently the coating film is photo-cured with the surface of the mold bonding thereto, thereafter the cured film on the film is peeled off at 90° from the surface of the mold, and thus, the mold release force is measured. The mold release force, that is, a value of a load when the cured film on the film is peeled off from the surface of the mold is converted into per 1 cm of the width of the film. The converted value is preferably more than 0 g/cm and 0.5 g/cm or less and more preferably 0.4 g/cm or less.

The film that is thus prepared from the imprint material of the present invention and to which a pattern is transferred, a semiconductor device including the film, and an optical member, a solid state imaging element, an LED device, a solar cell, a display, and an electronic device each of which includes the film on a substrate are also within the scope of the present invention.

EXAMPLES

Hereinafter, the present invention is further described in detail with reference to Examples and Comparative Examples. However, the present invention is not limited to these Examples.

Preparation of Imprint Material

Example 1

9.9 g of KAYARAD (registered trademark) DPEA-12 (hereinafter abbreviated as "DPEA-12" in this specification) (manufactured by Nippon Kayaku Co., Ltd.) and 0.1 g of N,N'-dimethylacrylamide (manufactured by Tokyo Chemical Industry Co., Ltd.) were mixed. To the mixture, 0.25 g of Lucirin (registered trademark) TPO (manufactured by BASF Japan Ltd.) (hereinafter abbreviated as "Lucirin TPO" in this specification) (2.5 phr to the total mass of DPEA-12 and N,N'-dimethylacrylamide) was added to prepare an imprint material PNI-a1.

Example 2

9.995 g of NK ester A-200 (hereinafter abbreviated as "A-200" in this specification) (manufactured by Shin-Nakamura Chemical Co., Ltd.) and 0.005 g of N,N'-dimethylacrylamide were mixed. To the mixture, 0.25 g of Lucirin TPO (2.5 phr to the total mass of A-200 and N,N'-dimethylacrylamide) was added to prepare an imprint material PNI-a2.

Example 3

9 g of A-200 and 1 g of N,N'-dimethylacrylamide were mixed. To the mixture, 0.25 g of Lucirin TPO (2.5 phr to the total mass of A-200 and N,N'-dimethylacrylamide) was added to prepare an imprint material PNI-a3.

Example 4

1.5 g of KAYARAD (registered trademark) PET30 (hereinafter abbreviated as "PET30" in this specification) (manufactured by Nippon Kayaku Co., Ltd.), 8 g of A-200, and 0.5 g of N,N'-dimethylacrylamide were mixed. To the mixture, 0.25 g of Lucirin TPO (2.5 phr to the total mass of PET30, A-200, and N,N'-dimethylacrylamide) was added to prepare an imprint material PNI-a4.

Example 5

6.5 g of A-200, 3 g of NK Economer A-1000PER (hereinafter abbreviated as "A-1000PER" in this specification) (manufactured by Shin-Nakamura Chemical Co., Ltd.), 0.5 g of N,N'-dimethylacrylamide, and 0.1 g of BYK-333 (manufactured by BYK Japan KK) (1 phr to the total mass of A-200, A-1000PER, and N,N'-dimethylacrylamide) were mixed. To the mixture, 0.25 g of Lucirin TPO (2.5 phr to the total mass of A-200, A-1000PER, and N,N'-dimethylacrylamide) was added to prepare an imprint material PNI-a5.

Example 6

5.5 g of A-200, 4 g of A-1000PER, 0.5 g of N,N'-dimethylacrylamide, and 0.1 g of BYK-333 (1 phr to the total mass of A-200, A-1000PER, and N,N'-dimethylacrylamide) were mixed. To the mixture, 0.25 g of Lucirin TPO (2.5 phr to the total mass of A-200, A-1000PER, and N,N'-dimethylacrylamide) was added to prepare an imprint material PNI-a6.

Example 7

9.9 g of DPEA-12 and 0.1 g of N,N'-diethylacrylamide (manufactured by Tokyo Chemical Industry Co., Ltd.) were mixed. To the mixture, 0.25 g of Lucirin TPO (2.5 phr to the total mass of DPEA-12 and N,N'-diethylacrylamide) was added to prepare an imprint material PNI-a7.

Example 8

3.9 g of DPEA-12, 3 g of A-200, 3 g of A-1000PER, 0.1 g of N,N'-diethylacrylamide, and 0.1 g of BYK-333 (1 phr to the total mass of DPEA-12, A-200, A-1000PER, and N,N'-diethylacrylamide) were mixed. To the mixture, 0.25 g of Lucirin TPO (2.5 phr to the total mass of DPEA-12, A-200, A-1000PER, and N,N'-diethylacrylamide) was added to prepare an imprint material PNI-a8.

Example 9

5 g of A-200, 4.5 g of NK ester APG-700 (hereinafter abbreviated as "APG-700" in this specification) (manufactured by Shin-Nakamura Chemical Co., Ltd.), and 0.5 g of N,N'-diethylacrylamide were mixed. To the mixture, 0.25 g of Lucirin TPO (2.5 phr to the total mass of A-200, APG-700, and N,N'-diethylacrylamide) was added to prepare an imprint material PNI-a9.

Example 10

7.99 g of A-200, 2 g of A-1000PER, 0.01 g of N,N'-diethylacrylamide, and 0.1 g of BYK-333 (1 phr to the total mass of A-200, A-1000PER, and N,N'-diethylacrylamide) were mixed. To the mixture, 0.25 g of Lucirin TPO (2.5 phr to the total mass of A-200, A-1000PER, and N,N'-diethylacrylamide) was added to prepare an imprint material PNI-a10.

Example 11

7.5 g of A-200, 2 g of A-1000PER, 0.5 g of N,N'-diethylacrylamide, and 0.1 g of BYK-333 (1 phr to the total mass of A-200, A-1000PER, and N,N'-diethylacrylamide) were mixed. To the mixture, 0.25 g of Lucirin TPO (2.5 phr to the total mass of A-200, A-1000PER, and N,N'-diethylacrylamide) was added to prepare an imprint material PNI-a11.

Example 12

9.9 g of DPEA-12 and 0.1 g of N,N'-(1,2-dihydroxyethylene)bisacrylamide (manufactured by Tokyo Chemical Industry Co., Ltd.) were mixed. To the mixture, 0.25 g of Lucirin TPO (2.5 phr to the total mass of DPEA-12 and N,N'-(1,2-dihydroxyethylene)bisacrylamide) was added to prepare an imprint material PNI-a12.

Example 13

5 g of A-200, 4.5 g of APG-700, 0.5 of N,N'-(1,2-dihydroxyethylene)bisacrylamide, and 0.1 g of BYK-333 (1 phr to the total mass of A-200, APG-700, and N,N'-(1,2-dihydroxyethylene)bisacrylamide) were mixed. To the mixture, 0.25 g of Lucirin TPO (2.5 phr to the total mass of A-200, A-1000PER, and N,N'-(1,2-dihydroxyethylene)bisacrylamide) was added to prepare an imprint material PNI-a13.

Example 14

7.5 g of A-200, 2 g of A-1000PER, 0.5 g of N,N'-(1,2-dihydroxyethylene)bisacrylamide, and 0.1 g of BYK-333 (1 phr to the total mass of A-200, A-1000PER, and N,N'-(1,2-dihydroxyethylene)bisacrylamide) were mixed. To the mixture, 0.25 g of Lucirin TPO (2.5 phr to the total mass of A-200, A-1000PER, and N,N'-(1,2-dihydroxyethylene)bisacrylamide) was added to prepare an imprint material PNI-a14.

Example 15

8.5 g of A-200, 0.5 g of A-1000PER, 1 g of N,N'-dimethylacrylamide, and 0.1 g of BYK-333 (1 phr to the total mass of A-200, A-1000PER, and N,N'-dimethylacrylamide) were mixed. To the mixture, 0.25 g of Lucirin TPO (2.5 phr to the total mass of A-200, A-1000PER, and N,N'-dimethylacrylamide) was added to prepare an imprint material PNI-a15.

Example 16

8.9 g of A-200, 0.1 g of A-1000PER, 1 g of N,N'-dimethylacrylamide, and 0.1 g of BYK-333 (1 phr to the total mass of A-200, A-1000PER, and N,N'-dimethylacrylamide) were mixed. To the mixture, 0.25 g of Lucirin TPO (2.5 phr to the total mass of A-200, A-1000PER, and N,N'-dimethylacrylamide) was added to prepare an imprint material PNI-a16.

Comparative Example 1

10 g of PET30 was prepared and 0.25 g of Lucirin TPO (2.5 phr to the total mass of PET30) was added thereto to prepare an imprint material PNI-b1.

Comparative Example 2

2 g of PET30 and 8 g of A-200 were mixed and 0.25 g of Lucirin TPO (2.5 phr to the total mass of PET30 and A-200) was added thereto to prepare an imprint material PNI-b2.

Comparative Example 3

6.5 g of A-200 and 3.5 g of A-1000PER were mixed and 0.25 g of Lucirin TPO (2.5 phr to the total mass of A-200 and A-1000PER) was added thereto to prepare an imprint material PNI-b3.

Comparative Example 4

5.5 g of A-200 and 4.5 g of APG-700 were mixed and 0.25 g of Lucirin TPO (2.5 phr to the total mass of A-200 and APG-700) was added thereto to prepare an imprint material PNI-b4.

Comparative Example 5

8.7 g of A-200 and 1.3 g of N,N'-dimethylacrylamide were mixed and 0.25 g of Lucirin TPO (2.5 phr to the total mass of A-200 and N,N'-dimethylacrylamide) was added thereto to prepare an imprint material PNI-b5.

Comparative Example 6

5 g of A-200, 3.7 g of APG-700, and 1.3 g of N,N'-dimethylacrylamide were mixed and 0.25 g of Lucirin TPO (2.5 phr to the total mass of A-200, APG-700, and N,N'-dimethylacrylamide) was added thereto to prepare an imprint material PNI-b6.

Comparative Example 7

5 g of A-200, 3.7 g of APG-700, 1.3 g of N,N'-dimethylacrylamide, and 0.1 g of BYK-333 (1 phr to the total mass of A-200, APG-700, and N,N'-dimethylacrylamide) were mixed and 0.25 g of Lucirin TPO (2.5 phr to the total mass of A-200, APG-700, and N,N'-dimethylacrylamide) was added thereto to prepare an imprint material PNI-b7.

Comparative Example 8

5 g of A-200, 3.7 g of APG-700, and 1.3 g of N,N'-diethylacrylamide were mixed and 0.25 g of Lucirin TPO (2.5 phr to the total mass of A-200, APG-700, and N,N'-diethylacrylamide) was added thereto to prepare an imprint material PNI-b8.

Comparative Example 9

5 g of A-200, 3.7 g of APG-700, and 1.3 g of N,N'-(1,2-dihydroxyethylene)bisacrylamide were mixed and 0.25 g of Lucirin TPO (2.5 phr to the total mass of A-200, APG-700, and N,N'-(1,2-dihydroxyethylene)bisacrylamide) was added thereto to prepare an imprint material PNI-b9.

[Mold Release Treatment of Mold]

A moth-eye pattern mold made from nickel and having a pitch of 250 nm and a height of 250 nm (manufactured by InnoX Co., Ltd.) and a silicon wafer were immersed in the solution made by diluting OPTOOL (registered trademark) DSX (manufactured by DAIKIN INDUSTRIES, LTD.) with Novec (registered trademark) HFE-7100 (hydrofluoro ether, manufactured by Sumitomo 3M Ltd.) (hereinafter abbreviated as "Novec HFE-7100" in this specification) to 0.1% by mass and were treated using a constant temperature and constant humidity device at a temperature of 90° and a humidity of 90 RH % for 1 hour. Thereafter, the treated mold and silicon wafer were rinsed with Novec HFE-7100 and then dried with air.

[Photo-Imprint and Mold Release Force Test]

Each imprint material obtained in Examples 1 to 16 and Comparative Examples 1 to 9 was applied onto a triacetyl cellulose film (FUJITAC (registered trademark) manufactured by FUJIFILM Corporation was used) (hereinafter abbreviated as "TAC film" in this specification) having a thickness of 80 μm using a bar coater (Full Automatic Film Applicator KT-AB3120, manufactured by COTEC CORPORATION). The coating film on the TAC film was bonded to the mold-release treated moth-eye pattern mold by pressure using a roller. Subsequently, photo-curing of the coating film was carried out through a light exposure at 350 mJ/cm$^2$ from the TAC film side using an electrodeless uniform radiation device (QRE-4016A, manufactured by ORC MANUFACTURING CO., LTD.). With reference to JIS Z0237, the 90° peeling test was carried out to measure a load when the cured film formed on the TAC film bonded to the surface of the mold having unevenness is completely peeled off from the surface of the mold having unevenness. A load per film width of 1 cm was calculated and the obtained value was determined to be the mold release force (g/cm). The results are shown in Table 1.

[Scratch Test Using Steel Wool]

A scratch test using steel wool was carried out for the cured film obtained after the mold release force test. A test device manufactured by DAIEI KAGAKU SEIKI MFG. CO., LTD was used and #0000 steel wool was used. The load per unit area was set to 15 g/cm$^2$, the steel wool was reciprocated 10 times, and the number of scratches after scratching operation was confirmed. The scratching test was repeated 3 times and the average number of scratches after scratching operation was evaluated as indicated below. The results are shown in Table 1.

0 to 1: A
2 to 5: B
6 to 10: C
11 or more: D

[Adhesion Test]

An adhesion test between the pattern-formed film and the TAC film was carried out for the cured coating film obtained after the mold release force test. The adhesion test was carried out in accordance with JIS K5400 with the following procedure.

First, in the pattern-formed film, 100 squares were formed by providing cutting lines with a cutter knife reached to the TAC film in a grid-like manner at intervals of 1 mm. An adhesive coated cellophane tape having a length of about 50 mm adhered onto the grid and was instantaneously peeled off at an angle of 90° to the film surface.

The squares after the tape peeling were observed. The number of squares which were not peeled off in the 100 squares was determined to be x. The adhesion was evaluated to be x/100. The adhesion test was repeated three times and the average value of each evaluation was calculated. The obtained results are listed in Table 1.

TABLE 1

|  | Mold release force (g/cm) | Scratch resistance using steel wool | Adhesion |
|---|---|---|---|
| Example 1 | 0.40 | A | 100/100 |
| Example 2 | 0.33 | A | 100/100 |
| Example 3 | 0.40 | A | 100/100 |
| Example 4 | 0.40 | A | 100/100 |
| Example 5 | 0.28 | A | 100/100 |
| Example 6 | 0.27 | A | 100/100 |
| Example 7 | 0.37 | A | 100/100 |
| Example 8 | 0.20 | A | 100/100 |
| Example 9 | 0.24 | A | 100/100 |
| Example 10 | 0.25 | A | 100/100 |
| Example 11 | 0.25 | A | 100/100 |
| Example 12 | 0.40 | A | 100/100 |
| Example 13 | 0.28 | A | 100/100 |
| Example 14 | 0.26 | A | 100/100 |
| Example 15 | 0.35 | A | 100/100 |
| Example 16 | 0.40 | A | 100/100 |
| Comparative Example 1 | 0.75 | D | 0/100 |
| Comparative Example 2 | 0.43 | B | 0/100 |
| Comparative Example 3 | 0.28 | A | 0/100 |
| Comparative Example 4 | 0.34 | A | 0/100 |
| Comparative Example 5 | 0.52 | C | 100/100 |
| Comparative Example 6 | 0.53 | C | 100/100 |
| Comparative Example 7 | 0.52 | C | 100/100 |
| Comparative Example 8 | 0.55 | C | 100/100 |
| Comparative Example 9 | 0.55 | C | 100/100 |

From the results in Table 1, the following results were obtained. When the imprint materials obtained in Examples 1 to 16 were used, any of the imprint materials showed significantly low mold release forces of 0.4 g/cm or less. The obtained cured coating films were determined to have a small number of, or 0 to 1 scratch resulting from the scratch test using steel wool and thus the scratch resistance of the cured films was confirmed. The obtained cured films also had excellent adhesion.

In contrast, when the imprint material, without containing the acrylamide compound, using the polymerizable compound having no alkylene oxide units obtained in Comparative Example 1 was used, the obtained cured film required large mold release force and had insufficient adhesion and a large number of scratches resulted from the scratch test using steel wool.

When the imprint materials prepared without containing the acrylamide compound obtained in Comparative Examples 2 to 4 were used, the obtained cured films resulted in insufficient adhesion.

When the imprint materials obtained in Comparative Examples 5 to 9 in which contents of the acrylamide compound were increased were used, a large number of scratches were made in the cured films resulting from the scratch test using steel wool.

As described above, the film obtained from the imprint material of the present invention requires low mold release strength, has the excellent scratch resistance after the imprint, and has excellent adhesion to the substrate.

The invention claimed is:

1. An imprint material comprising:
   an (A) component;
   a (B) component; and
   a (C) component:
   (A) a compound of Formula (1);
   (B) a compound having alkylene oxide units and having 2 to 6 polymerizable groups at the ends of the compound, in which the alkylene oxide units are ethylene oxide units, propylene oxide units, or a combination thereof; and
   (C) a photopolymerization initiator

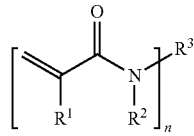

(1)

in the formula, $R^1$ is a hydrogen atom or a methyl group; $R^2$ is a hydrogen atom or a $C_{1-3}$ alkyl group; n is 1 or 2;
   when n is 1,
   $R^3$ is a $C_{1-12}$ alkyl group optionally substituted with at least one substituent selected from the group consisting of a carboxy group, an acetyl group, an amino group in which one or two hydrogen atoms are optionally substituted with a methyl group, a sulfo group, and a $C_{1-4}$ alkoxy group; and
   when n is 2,
   $R^3$ is a $C_{1-12}$ alkylene group optionally substituted with at least one substituent selected from the group consisting of a hydroxy group, a carboxy group, an acetyl group, an amino group in which one or two hydrogen atoms are optionally substituted with a methyl group, a sulfo group, and a $C_{1-4}$ alkoxy group,
   wherein the (A) component is contained in an amount of 0.05% by mass or more and 10% by mass or less relative to the total mass of the (A) component and the (B) component.

2. The imprint material according to claim 1, further comprising a silicone compound as a (D) component.

3. The imprint material according to claim 1, further comprising a surfactant as an (E) component.

4. The imprint material according to claim 1, further comprising a solvent as an (F) component.

5. The imprint material according to claim 1, wherein the (B) component is a compound having two polymerizable groups.

6. The imprint material according to claim 1, wherein the (B) component is a compound having two groups of at least one polymerizable group selected from the group consisting of an acryloyloxy group, a methacryloyloxy group, a vinyl group, and an allyl group.

7. The imprint material according to claim 1, wherein n is 1.

8. The imprint material according to claim 1, wherein n is 2.

9. The imprint material according to claim 1, wherein component (A) comprises at least one of N,N'-dimethyl(meth)acrylamide, N,N'-diethyl(meth)acrylamide and N,N'-(1,2-dihydroxyethylene)bis(meth)acrylamide as the compound of Formula (1).

10. The imprint material according to claim 1, wherein component (A) comprises at least one of N,N'-dimethylacrylamide, N,N'-diethylacrylamide and N,N'-(1,2-dihydroxyethylene)bisacrylamide as the compound of Formula (1).

11. A film that is formed from the imprint material as claimed in claim 1 and to which a pattern is transferred.

12. An optical member comprising the pattern-transferred film as claimed in claim 11 provided on a substrate.

13. A solid state imaging device comprising the pattern-transferred film as claimed in claim 11 provided on a substrate.

14. An LED device comprising the pattern-transferred film as claimed in claim 11 provided on a substrate.

15. A semiconductor device comprising the pattern-transferred film as claimed in claim 11.

16. A solar cell comprising the pattern-transferred film as claimed in claim 11 provided on a substrate.

17. A display comprising the pattern-transferred film as claimed in claim 11 provided on a substrate.

18. An electronic device comprising the pattern-transferred film as claimed in claim 11 provided on a substrate.

* * * * *